United States Patent [19]

Ikeda et al.

[11] Patent Number: 4,828,629
[45] Date of Patent: May 9, 1989

[54] PROCESS OF FABRICATING SILICON OXIDE AND GETTERING FILMS ON POLYCRYSTALLINE SILICON RESISTANCE ELEMENT

[75] Inventors: Shuji Ikeda, Koganei; Satoshi Meguro, Hinode, both of Japan

[73] Assignee: Hitachi, Ltd., Tokyo, Japan

[21] Appl. No.: 841,777

[22] Filed: Mar. 20, 1986

[30] Foreign Application Priority Data

Mar. 20, 1985 [JP] Japan .................................. 60-54554

[51] Int. Cl.[4] .......................................... H01L 21/322
[52] U.S. Cl. ..................... 148/33.3; 437/12; 437/52; 357/59; 357/51
[58] Field of Search ................... 437/12, 231, 233, 60; 357/59; 148/DIG. 60, DIG. 61, 33.3

[56] References Cited

U.S. PATENT DOCUMENTS

| | | | |
|---|---|---|---|
| 4,123,564 | 10/1978 | Ajima et al. | 427/255 |
| 4,196,232 | 4/1980 | Schnable et al. | 427/255.3 |
| 4,260,425 | 4/1981 | Ulrich et al. | 427/344 |
| 4,326,213 | 4/1982 | Shirai et al. | 357/51 |
| 4,563,241 | 1/1986 | Tanaka et al. | 156/643 |
| 4,620,986 | 11/1986 | Yau et al. | 437/12 |

OTHER PUBLICATIONS

Ghandhi, *V.L.S.I. Fabrication Principles*, John Wiley & Sons, Inc. (1983), pp. 422, 423.

*Primary Examiner*—Olik Chaudhuri
*Attorney, Agent, or Firm*—Antonelli, Terry & Wands

[57] ABSTRACT

Multi-layer film including a silicon oxide film formed by the CVD method and a film having a gettering function is used as a layer insulation film in a semiconductor device having a resistance constituted by polycrystalline silicon, so that an impurity is not introduced into a resistance element formed in the (intrinsic) polycrystalline silicon, which is thereby stabilized, resulting in an improved characteristic of the semiconductor device. A third layer, of Spin on Glass, can be formed on the film having a gettering function so as to improve the flatness of the layer insulation film.

33 Claims, 9 Drawing Sheets

PROCESS OF FABRICATING SILICON OXIDE AND GETTERING FILMS ON POLYCRYSTALLINE SILICON RESISTANCE ELEMENT

BACKGROUND OF THE INVENTION

The present invention relates to a semiconductor device and the process of fabricating the same and particularly to a semiconductor device with its resistance elements constituted by, e.g., polycrystalline silicon.

It is undesirable for a semiconductor device having a high-resistance element (e.g., a resistor) formed of polycrystalline silicon, for example, a SRAM (Static type RAM) using this kind of high-resistance element as a load capacity of a memory cell, to have directly on its high-resistance element a PSG (phosphosilicate glass) film as a layer insulating film having a gettering function. This high-resistance element is formed by utilizing as the resistance an intrinsic portion of a polycrystalline silicon layer, to which diffused impurities are not added, the remainder of which polycrystalline silicon layer is constructed as a conductive layer. If the PSG film is directly formed on this resistance element (e.g., on the intrinsic portion of the polycrystalline silicon layer), phosphorus contained in the PSG film is diffused into the intrinsic portion so as to lower the value of resistance or the stability of the high-resistance element.

Accordingly, a silicon oxide ($SiO_2$) film formed on the surface of the polycrystalline silicon high-resistance element by thermal oxidation is possible. The silicon oxide film is constructed as a shielding film for the purpose of preventing this diffusion.

However, even if such construction is applied, an impurity (phosphorus, etc.) which is introduced in other portions of, e.g., the polycrystalline silicon layer, other than the intrinsic portion, so as to make them electrically conductive, is automatically doped to the intrinsic portion during the thermal oxidation process, thus making the value of the high-resistance element unstable, because the thermal oxidation process for forming the silicon oxide film on the high-resistance element requires heating at a high temperature of about 900° C.

There is also a problem of a reduced coverage of an aluminum film due to the inferior flatness of insulation films such as the, e.g., combination of thin silicon oxide film and PSG film, described above, and on which the aluminum film is formed.

SUMMARY OF THE INVENTION

An object of the present invention is to provide a semiconductor device, including a layer of semiconductor material (e.g., polycrystalline silicon) having minimally doped or non-doped portions, the dopant level of such portions being kept stable, and a fabrication method thereof.

A further object of the present invention is to provide a semiconductor device, including a layer of polycrystalline semiconductor material (e.g., polycrystalline silicon) having minimally doped or non-doped portions and heavily doped portions, wherein the level of impurity doping (or non-doping) of the minimally or non-doped portions is kept stable, and a fabrication method thereof.

A further object of the present invention is to provide a semiconductor device, including a layer of polycrystalline semiconductor material (e.g., polycrystalline silicon) having minimally doped or non-doped portions with or without other more heavily doped portions, and a layer of an insulation material having a gettering function on such layer of polycrystalline semiconductor material, wherein the level of impurity doping (or non-doping) of the minimally doped or non-doped portions is kept stable, and a fabrication method thereof.

A further object of the present invention is to provide a semiconductor device, having resistor elements formed from a layer of polycrystalline semiconductor material (e.g., polycrystalline silicon), the resistor elements constituting intrinsic portions of the layer of polycrystalline semiconductor material, with other portions of such layer being more heavily doped, such layer of polycrystalline semiconductor material having a layer of an insulation material having a gettering function (such as phosphosilicate glass) thereon, wherein introduction of impurities into the intrinsic portions is prevented so as to maintain such portions intrinsic and keep the resistance of the resistance elements stable, and a fabrication method of this device.

A further object of the present invention is to provide a semiconductor device and its fabrication process in which the characteristics of the device can be improved by preventing fluctuations of the resistance value of a high-resistance element formed of polycrystalline silicon, thereby making it stable.

Another object of the present invention is to provide a semiconductor device and its fabrication method in which a coverage of a wiring can be improved by improving the flatness of a layer insulation film.

The above-described and other objects and novel features of the present invention will be apparent in the following description of this specification with reference to the accompanying drawings.

The specific examples of the present invention disclosed in this application are briefly described as follows. However, the present invention is not limited to such specific examples.

A multi-layer film having at least a silicon oxide film formed by the CVD (chemical vapor deposition) method and a film having a gettering function is used as a layer insulation film of a semiconductor device in which a resistance is formed of polycrystalline silicon. The introduction of impurities into a polycrystalline silicon resistance is thereby prevented so that the resistance is stabilized and the characteristics of the device can be improved. A third layer can be provided on the film having a gettering function, said third film being, e.g., a Spin on Glass film, so as to improve the flatness of the layer insulation film.

BRIEF DESCRIPTION OF THE DRAWINGS

The aforementioned and other objects and novel features of the present invention will become apparent from the following description taken with reference to the accompanying drawings, in which:

FIGS. 4 to 10 are views showing the memory cell of an SRAM at various manufacturing steps for explaining a manufacturing process of one embodiment of the present invention, in which:

FIGS. 4 to 6 are plan views thereof, and

FIGS. 7 to 10 are sectional views thereof.

DESCRIPTION OF THE PREFERRED EMBODIMENTS

First Embodiment

This embodiment relates to a semiconductor integrated circuit device and particularly to a technique which is effective when applied to a semiconductor device having a static random access memory (hereinafter referred to as a SRAM).

A memory cell of the SRAM consists of a flip-flop circuit formed by cross-coupling a pair of inverter circuits. Each inverter circuit is formed by connecting a load element and a driving MISFE (gate insulated field effect transistor) in series. The power source potential is applied to a common terminal of the two load elements. A common source of the two driving MISFETs is supplied with the ground potential of the circuit.

A SRAM is a type of memory cell in which a resistance element made of polycrystalline silicon, which has as a resistance element an extremely high value of resistance ($10^{11}$ Ω/□), is used as a load element in order to lower the power consumption. A memory cell of this type is most suitable for integration at a high degree, because its resistance element can be formed over the driving MISFET.

The present invention is described hereinafter with respect to the embodiment in which the present invention is applied to a SRAM whose flip-flop circuit of a memory cell is constituted by two resistance elements and two MISFETs.

Figure 1:
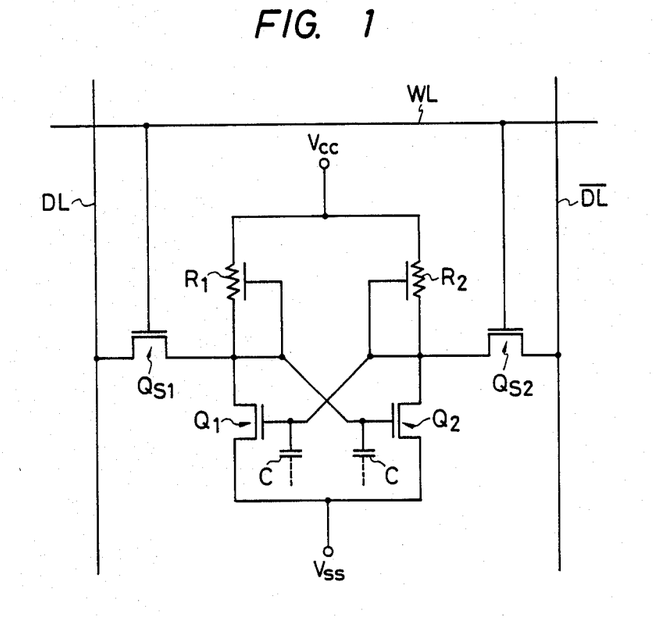
FIG. 1 is an equivalent circuit diagram showing the memory cell of an SRAm for explaining one embodiment of the present invention.

FIG. 1 is an equivalent circuit diagram showing a memory cell of a SRAM with which one embodiment of the present invention is described.

In all the drawings showing embodiments, portions having the same function are given the same numerals, and the repetitious description about them is omitted.

In FIG. 1, a plurality of word lines indicated by WL and extending in the direction of rows are arranged in the direction of columns (the direction of extension of word lines is hereinafter referred to as the direction of rows).

A plurality of complementary data lines DL and $\overline{DL}$ extend in the direction of columns and are arranged in the direction of rows (the direction of extension of data lines is hereinafter referred to as the direction of columns).

The memory cell of the SRAM is constituted by a flip-flop having a pair of output and input terminals and by switching MISFETs $Q_{s1}$ and $Q_{s2}$ respectively connected to these output and input terminals. A plurality of memory cells are disposed at given portions of intersections of the word lines WL and the data lines DL and $\overline{DL}$ so as to form memory cell arrays.

One of source and drain regions of the switching MISFET is connected to the data line DL or $\overline{DL}$ and the other is connected to the input or output terminals of the flip-flop circuit. The word line WL is connected to the gate electrodes of the switching MISFETs $Q_{s1}$ and $Q_{s2}$. The MISFETs $Q_{s1}$ and $Q_{s2}$ are switches controlled by the word line WL and adapted for selectively connecting the flip-flop with the data lines DL and $\overline{DL}$. The flip-flop circuit is constituted by the MISFETs $Q_1$ and $Q_2$ and resistances $R_1$ and $R_2$. This flip-flop circuit accumulates an information of "1" or "0" transmitted from the data lines DL and $\overline{DL}$. The flip-flop circuit consists of two cross-coupled inverter circuits. Each inverter circuit consists of resistance elements $R_1$ and $R_2$ as the load and driving MISFETs $Q_1$ and $Q_2$. The output of one inverter is fed as the input of the other inverter to the gate electrode of the driving MISFET of the other inverter.

The inverter circuits are supplied with the power source potential $V_{cc}$ through the resistances $R_1$ and $R_2$. These resistance elements $R_1$ and $R_2$ are adapted for controlling an amount of current supplied from the power source $V_{cc}$ so as to stably hold written information. The resistance elements $R_1$ and $R_2$ are self-biased, according to the present invention. That is, the value of resistance is changed so as to correspond to a signal to be outputted from the inverter circuit. Memory cells according to FIG. 1, including self-biased resistors $R_1$ and $R_2$, are described in U.S. application Ser. No. 764,208, filed Aug. 8, 1985, the contents of which are incorporated herein by reference.

The two inverter circuits are connected through a common wiring to the fixed potential, for example, the ground potential $V_{cc}$ of the circuit. Accordingly, the sources of the two driving MISFETs are connected to a common ground potential wiring.

It is possible to think that the written information is accumulated in a parasitic capacitance C. The parasitic capacitance C is mainly defined by a capacitance of each gate electrode of the MISFETs $Q_1$ and $Q_2$ and a junction capacitance between one semiconductor region (the source region or the drain region) and the substrate.

Figure 2:
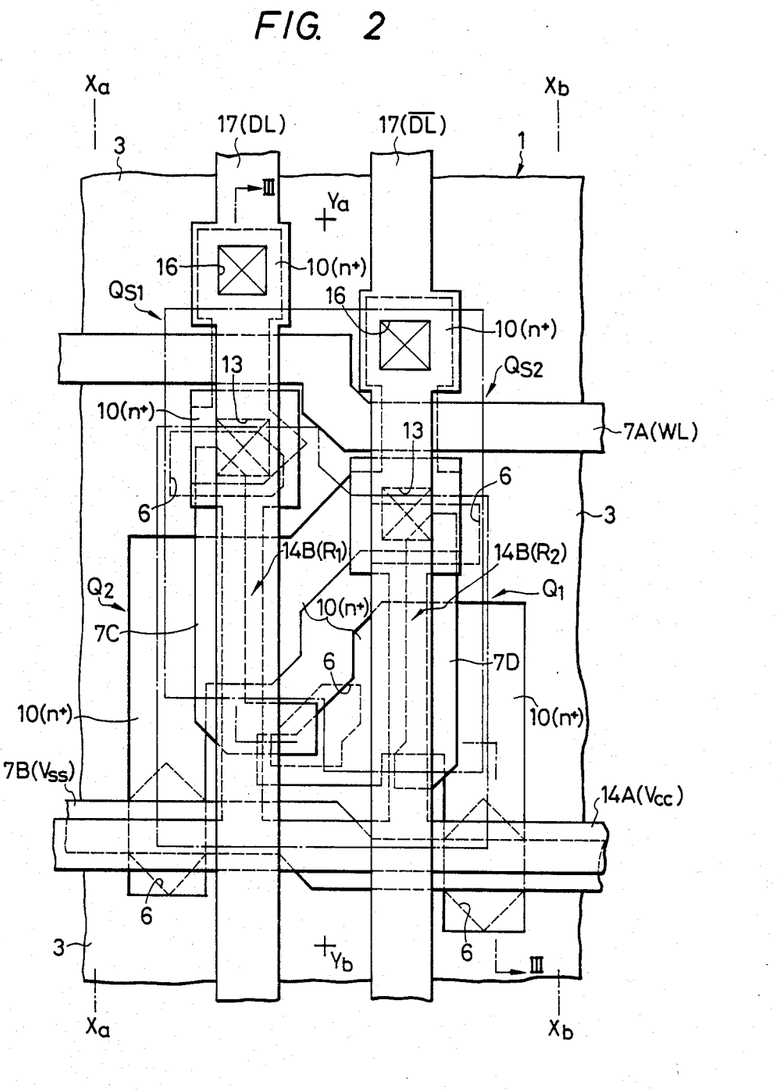
FIG. 2 is a plan view showing the memory cell of an SRAM for explaining one embodiment of the present invention.
Figure 3:
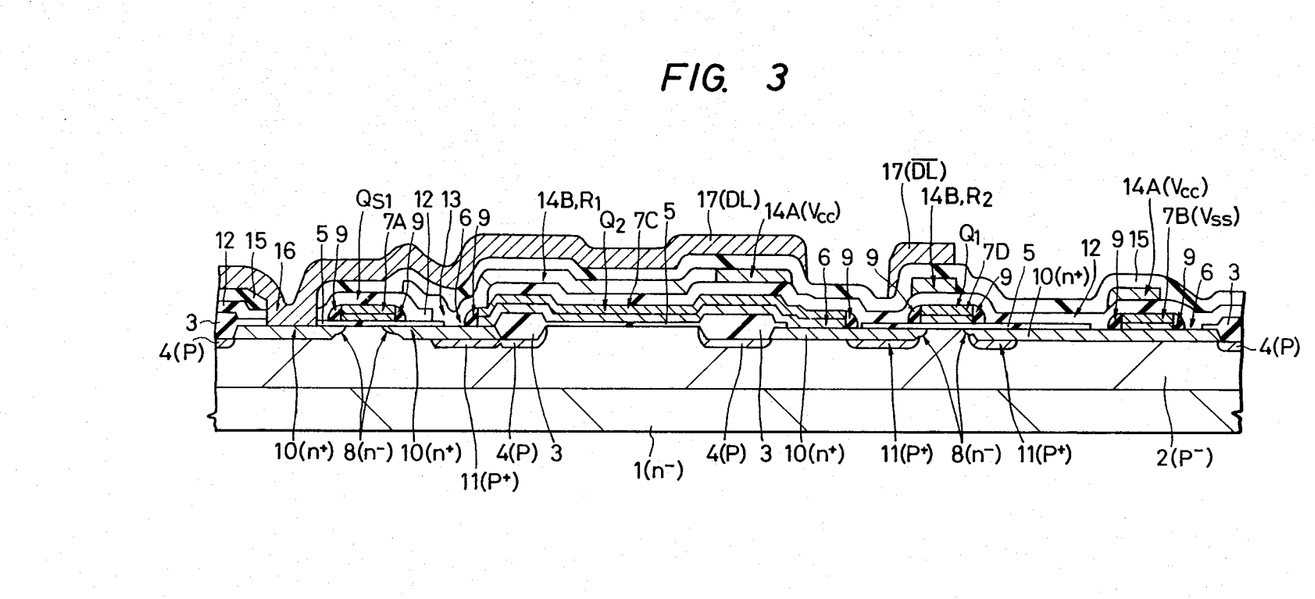
FIG. 3 is a sectional view taken along line III—III in FIG. 2.

FIG. 2 is a plan view showing the memory cell of the SRAM according to the present invention. FIG. 3 is a cross-sectional view along the section line III—III of FIG. 2. In the plan views of FIG. 2, and FIGS. 4 to 6 which are described later, other insulation films than field insulation films are not shown so that the constitution of this embodiment can be readily understood.

In FIGS. 2 and 3, a numeral 1 denotes a semiconductor substrate consisting of $n^-$-type single crystal silicon. A $p^-$-type well region 2 is provided on a given main surface portion of the semiconductor substrate 1. A field insulation film 3 is provided on the main surface of the semiconductor substrate 1 and the well region 2. The field insulation film 3 electrically separates semiconductor elements. A p-type channel stopper region 4 is provided at the well region 2 under the field insulation film 3. This channel stopper region 4 prevents the operation of the parasitic MISFET so as to electrically separate semiconductor elements.

In the SRAM of this embodiment, the memory cell is constituted by n-channel MISFETs. The n-channel MISFETs are formed in the $p^-$-type well region 2. Peripheral circuits of the memory cell (a sense amplifier, a decoder, a timing signal generator, input and output circuits, etc.) which are not shown in the drawing are composed of complementary MIS circuits. N-channel and p-channel MISFETs constituting the complementary MIS circuit are respectively formed in the $p^-$-type well region and the $n^-$-type semiconductor substrate 1. Each MISFET is substantially surrounded at its circumference and defined in its form by the field insulation film 3. That is, the MISFETs are formed in regions (active regions) where the field insulation film is not formed.

The switching MISFETs $Q_{s1}$ and $Q_{s2}$ consist of insulation films 5 as gate insulation films, conductive layers 7A as gate electrodes, $n^-$-type and $n^+$-type semiconductor regions 8 and 10 as source and drain regions, and $p^+$-type semiconductor regions 11 for preventing soft errors. The MISFET $Q_1$ consists of an insulation film 5 as a gate insulation film, a conductive layer 7D as a gate electrode, $n^-$-type and $n^+$-type semiconductor regions 8 and 10 as source and drain regions and a $p^+$-type semiconductor region 11 for preventing soft errors. The MISFET $Q_2$ is constituted by a insulation film 5 as a gate insulation film, a conductive layer 7C as a gate electrode, $n^-$-type and $n^+$-type semiconductor regions 8 and 10 as source and drain regions and a $p^+$-type semiconductor region 11 for preventing soft errors.

The MISFETs $Q_1$, $Q_2$, $Q_{s1}$ and $Q_{s2}$ are formed in the well region 2.

The gate insulation film 5 is made of a silicon dioxide film formed on the main surface of the semiconductor substrate 1 and the well region 2 which is an active region.

The gate electrodes 7A, 7C and 7D are constructed by a 2-layer film (polycide structure) consisting of a polycrystalline silicon film and a silicide film formed on this polycrystalline film and made of compounds of silicon and metals with a high melting temperature (for example, molybdenum, tantalum, titanium, and tungsten). Alternatively, the conductive layers 7A, 7C and 7D may be constructed of silicide film, a film of a metal with a high melting temperature (note the metals described above), etc. The gate electrode 7A extends over the field insulation film 3 in the direction of rows. That is, the conductive layer 7A is used as the word line WL.

The source and drain regions are formed in the so-called LDD (Lightly Doped Drain) structure, as is known in the art. Impurity introducing masks (used as impurity introducing masks in forming the LDD structure) 9, of insulating films, are provided at both sides of the conductive layers 7A to 7D by means of self-matching thereto in order to form the LDD structure. The impurity introducing masks 9 may be removed after the semiconductor region 10 and the $p^+$-type semiconductor region 11 are formed. The semiconductor region 8 has a lower impurity concentration than the semiconductor region 10, so that the intensity of an electric field occurring at the pn junction between the semiconductor region 8 and the well region can be lowered. The electric field passing around under the gate electrode (a region where a channel is formed) can be reduced because of a shallow junction depth (xj) of the semiconductor region 8 junction. The semiconductor regions 8 are formed through the ion implantation process by mainly employing the gate electrodes 7A, 7C and 7D as masks. The semiconductor region 10 constitutes the substantial source or drain regions or a cross-coupling wiring of the flip-flop circuit. The semiconductor region 10 is formed after it is implanted with an impurity through the ion implantation process by employing the impurity introducing mask 9. The impurity introducing mask 9 and the semiconductor region 8 are omitted in various of the drawings.

Next, the fabrication process for this embodiment is described.

Figure 4:
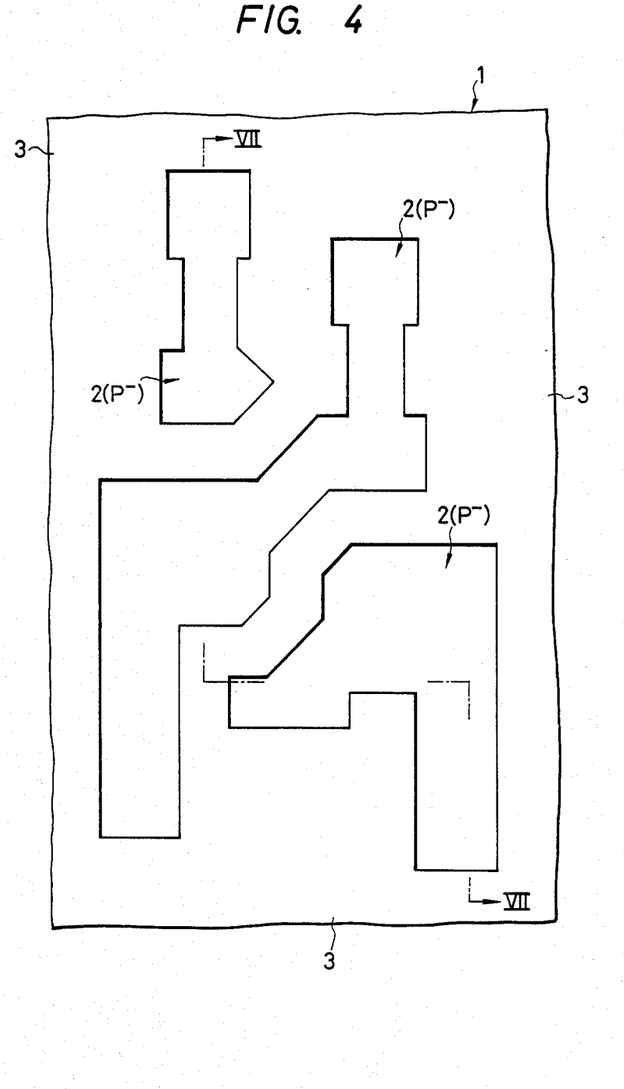
Figure 5:
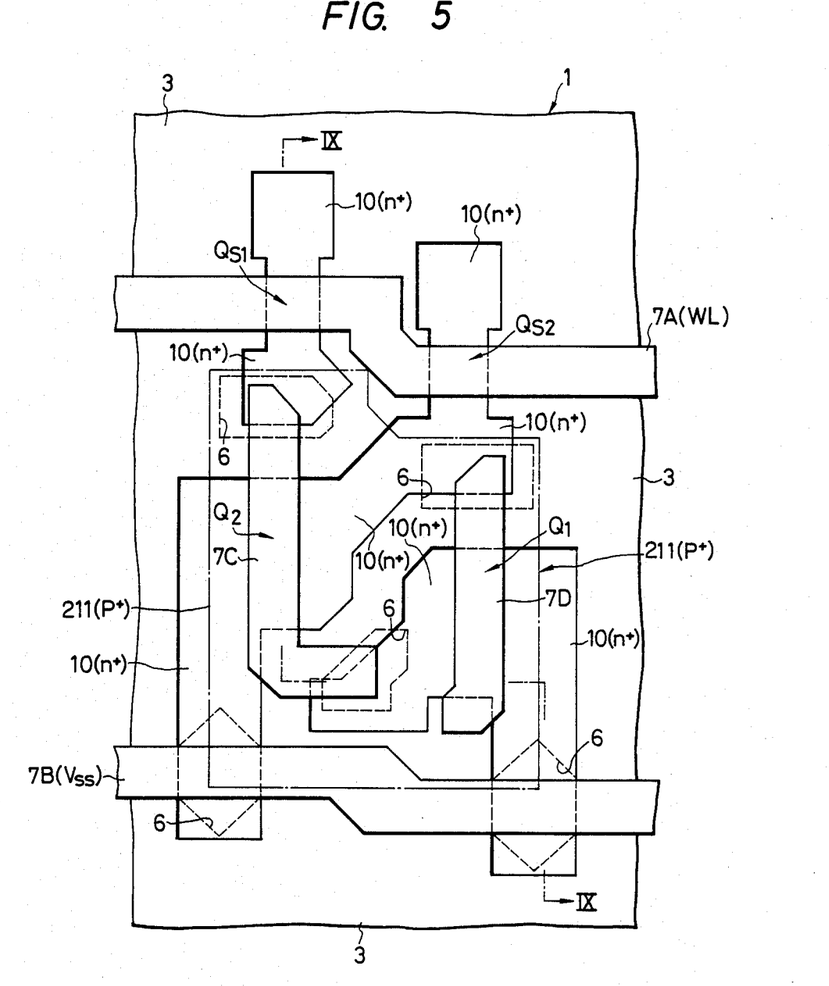
Figure 6:
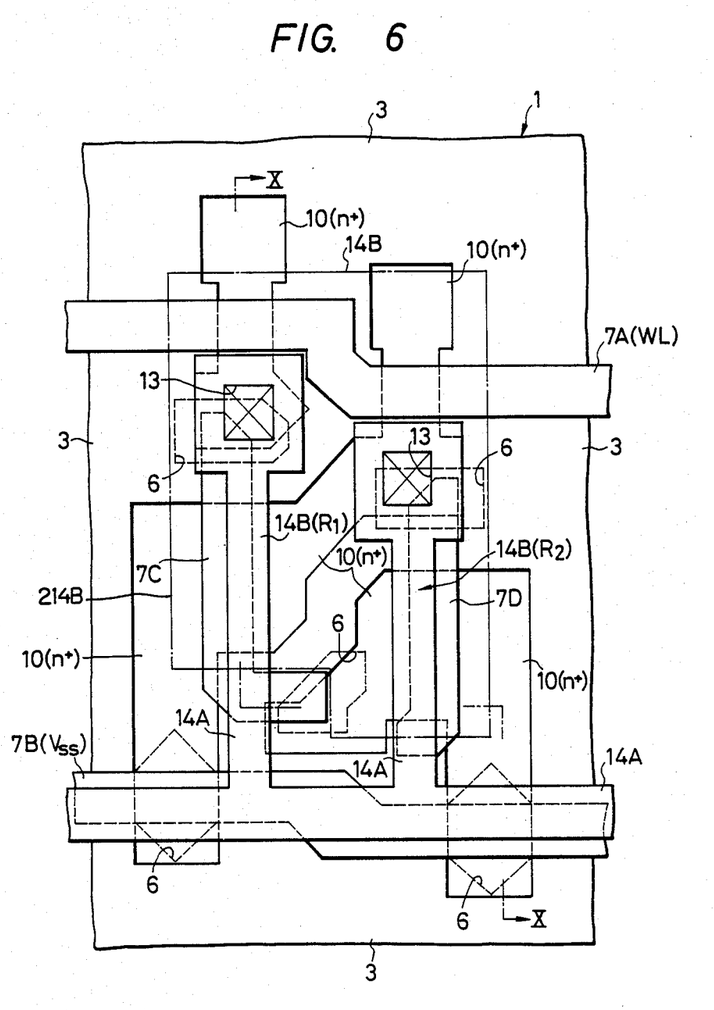
Figure 7:
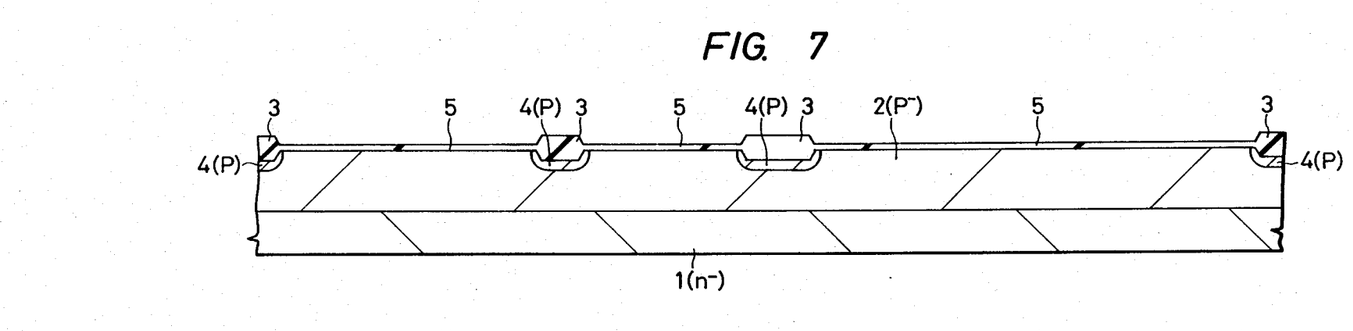
Figure 8:
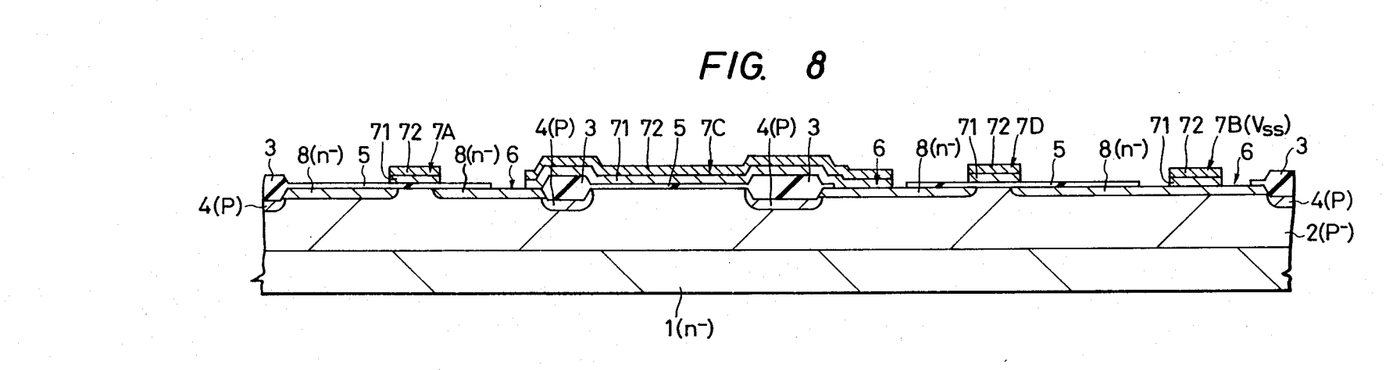
Figure 9:
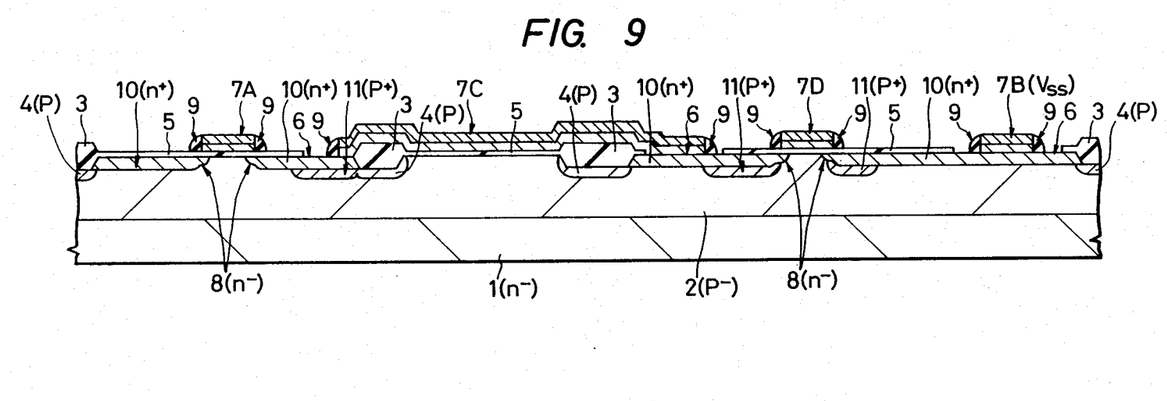
Figure 10:
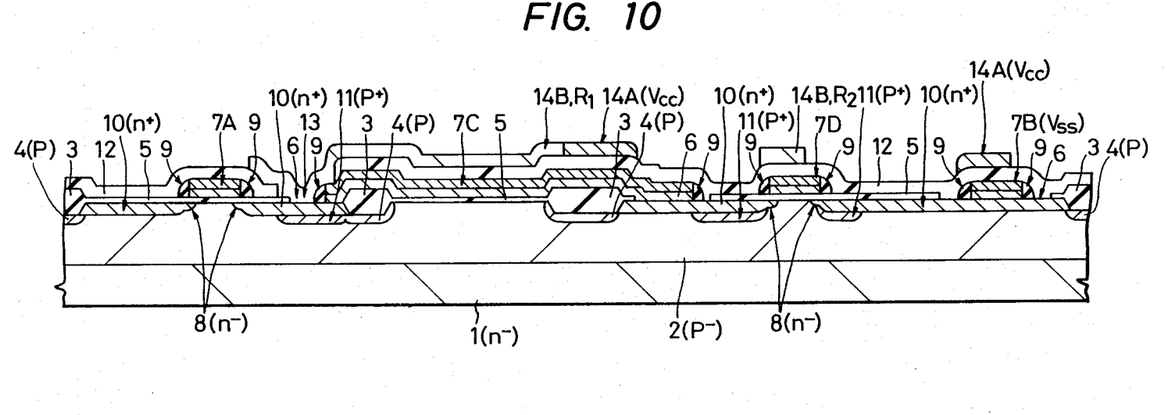

FIGS. 4 to 10 are diagrams for indicating the fabrication process of the SRAM. FIGS. 4 to 6 are plan views of the memory cell of the SRAM shown in each step of the fabrication process. FIGS. 7 to 10 are cross-sectional views of the same. FIG. 7 is a cross-section taken on the section line VII—VII of FIG. 4. FIG. 9 is a cross-section taken on the section line IX—IX of FIG. 5. FIG. 10 is a cross-section taken on the section line X—X of FIG. 6.

First, the $n^-$-type semiconductor substrate 1 made of single crystal silicon is provided. The $p^-$-type well region 2 is formed on the given main surface portion of this semiconductor substrate 1. The well region 2 is formed by, for example, introducing $BF_2$ ion of about $2 \times 10^{12}$ atoms/cm$^2$ in the ion implantation process of about 60 KeV energy and extending and diffusing it, as is known in the art.

The field insulation film 3 is formed on a given portion of the semiconductor substrate 1 and the well region 2. The p-type channel stopper region 4 is formed in a given portion of the well region 2. A silicon oxide film formed by selective thermal oxidation technique, as known in the art, is used as the field insulation film 3. The channel stopper region 4 is formed by, for example, introducing $BF_2$ ion of about $3 \times 10^{13}$ atoms/cm$^2$ in the ion implantation process of about 60 KeV energy and by annealing in the formation process of the field insulation film 3.

Next, the insulation film 5 is formed on the main surface of the semiconductor substrate 1 and the well region 2, as shown in FIG. 7. The surface region is a region where semiconductor elements are formed. The insulation film 5 is, for example, a silicon oxide film of 200–300 Å in thickness formed by thermal oxidation.

After the insulation film 5 is formed, given portions of the insulation film 5 are removed, and contact holes 6 are formed.

The conductive layers 7A to 7D are formed on the field insulation film 3 and the insulation film 5, as shown in FIG. 8. The conductive layers 7A to 7D are connected to given portions of the main surface region through the contact holes 6. The conductive layers 7A to 7D consist of dual-layer films. Each of them is formed by, for example, a polycrystalline silicon layer 71 which is formed by CVD (Chemical Vapor Deposition), with phosphorus introduced in it in order to reduce its resistance value, and a molybdenum silicide film 72 formed on this polycrystalline silicon layer 71 by, e.g., sputtering. The method of forming the dual-layer films is known in the art. The film thickness of the polycrystalline silicon film 7 is about 2000 Å, and that of the molybdenum silicide film 72 is about 3000 Å. As the conductive layers 7A to 7D contain molybdenum silicide 7a, their resistance value can be set at several $\Omega/\square$.

The portions of the main surface of the well region 2 which are connected with the conductive layers 7A to 7D through the contact holes 6 and are not shown in the figures are provided with diffused phosphorus, which has been introduced in the polycrystalline silicon film 71, so as to form an n-type semiconductor region.

Next, as shown in FIG. 8, $n^-$-type semiconductor regions 8 are formed, e.g., in the well region 2 at both sides of the conductive layers 7A, 7C and 7D, through the insulation film 5 on the main surface of the well domain 2, in order to construct the LDD (Lightly Doped Drain) structure. The conductive layers 7A, 7C and 7D and field insulation film 3 are used as masks for introducing an impurity, and phosphorus is introduced by ion implantation of, for example, about $1 \times 10^{13}$ atoms/cm$^2$, at an energy of about 50 KeV. After this, the semiconductor region 8 is formed by annealing, as done conventionally in the art. As an example of such annealing, the ion-implanted structure can be heated at a temperature of about 950° C. in a nitrogen atmosphere, for about 20 minutes. Such annealing is exemplary of the annealing herein.

The impurity introducing masks 9 are formed on both sides of the conductive layers 7A to 7D by self-alignment, after the semiconductor region 8 is formed. One method of forming the impurity introducing mask 9 is that a silicon oxide film is formed over the whole area of the substrate by CVD and is processed by a reactive ion etching. The masks 9 are insulation films which are formed by self-alignment with respect to the conductive layers 7A to 7D.

The n+-type semiconductor regions 10 are formed in given portions in the main surface region of the well region 2 by employing the impurity introducing masks 9 and the conductive layers 7A to 7D as masks in the ion-implantation process. The semiconductor region 10 constitutes the source or the drain region of the MISFET. For example, arsenic is introduced by ion implantation of about $1\times10^{16}$ atoms/cm$^2$ at about 80 KeV, followed by annealing.

After this, an impurity introducing mask is formed for the purpose of forming the p+-type semiconductor region for mainly preventing soft errors. This mask covers all portions except regions enclosed by alternate long and short dashed lines 211 of FIG. 5. As shown in FIGS. 5 and 9, the ion-implantation process using as masks the impurity introducing mask 9 and the conductive layers 7C and 7D is carried out, while utilizing this impurity introducing mask. The p+-type semiconductor region 11 is thereby formed under given semiconductor regions 10. For example, boron is introduced by ion implantation of about $1\times10^{13}$ atoms/cm$^2$ at an energy of about 50 KeV, followed by annealing. In FIG. 5, an impurity for forming the semiconductor region 11 is introduced in the regions encircled by the alternate long and short dash lines 211 through the insulation film 5.

The conductive layers 7A to 7D and the semiconductor regions 8 and 10 are formed through the same fabrication process as the formation process for MISFETs constituting peripheral circuits. The semiconductor regions 11 may be formed under given n+-type semiconductor regions, for example, source and drain regions of MISFETs constituting an input protection circuit.

After the process of forming the semiconductor region 11, an insulation film 12 is formed. The insulation film 12 is, for example, a silicon oxide film of about 1000–2000 Å thickness formed by CVD. The insulation film 12 is selectively removed, by conventional techniques, at its portions on given conductive layers 7C and 7D and semiconductor regions 10 so as to form contact holes 13.

After this, a polycrystalline silicon film 14 connected with given semiconductor regions 1 through the contact holes 13 is formed for the purpose of forming a voltage supply wiring 14A and resistance elements 14B. This polycrystalline silicon film is, for example, a film of 1000–2000 Å thickness formed by CVD. An impurity is introduced into a portion of the polycrystalline silicon film except portions for formation of the resistance elements 14B, by conventional techniques; that is, an impurity is introduced into a portion in which the conductive layer 14A is formed, for the purpose of reducing the resistance value of such portion. Arsenic can be used as the impurity, and can be introduced by ion implantation, followed by annealing, as is known in the art. High controllability of the resistance value is realized, as the impurity is introduced through the ion-implantation process. An amount of impurity passing around behind the impurity introducing mask is small because of using the ion-implantation method. Accordingly, the dimension margin in processing can be reduced, and the resistance element 14B can be formed so as to be sufficiently long.

After this, as shown in FIGS. 6 and 10, the polycrystalline silicon film is given a patterning so as to form the conductive layer 14A used as a voltage supply wiring, and the resistance elements 14B used as resistance elements $R_1$ and $R_2$. The impurity introduced for the purpose of forming the conductive layer 14A is introduced in the polycrystalline silicon film except portions enclosed by the alternate long and short dashed lines 214B of FIG. 6.

An insulation film 15 (FIG. 3) is formed after the process of forming the conductive layer 14A and the resistance element 14B.

The insulation films 5, 12 and 15 are removed at their portions on given semiconductor regions 10 so as to form contact holes 16.

After this, conductive layers 17 connected with given semiconductor regions 10 through the contact holes 16 are formed, as shown in FIGS. 2 and 3. The conductive layers 17 extend in the direction of columns so as to cross the conductive layer 7A on the insulation film 15. The conductive layer 17 is, for example, an aluminum film formed by sputtering. A treatment process for a passivation film, etc. is carried out after this. The SRAM of this embodiment is completed through the sequence of this fabrication process.

The insulation film 15 which is featured in the semiconductor device according to the present invention is a layered film consisting of a non-doped silicon oxide film formed by the high-temperature and low-pressure CVD method without any diffused impurities, a PSG film as a gettering film formed on this silicon oxide film, and a SOG (Spin On Glass) film formed on this PSG film. This is described more in detail as follows.

The non-doped silicon oxide film, formed by the high-temperature and low-pressure CVD method (e.g., by reacting $Si(OC_2H_5)$ and $O_2$, at a temperature of 740° C.±20° C., for about 9 minutes, at a pressure of 0.5 Torr±0.1 Torr) without any diffused impurities, is stacked on the surface of a conductive layer having an intrinsic portion formed as a high-resistance in a part of a polycrystalline silicon layer. Such silicon oxide film should have a minimum thickness of 500 Å, and, as an example, can have a thickness of 1500 Å. A PSG film as a gettering film is formed on this non-doped silicon oxide film. Such PSG film can have a thickness of, e.g., 3000 Å±300 Å. The phosphorus concentration in the PSG glass can be 2 mol % to 10 mol %, with 3.9±0.5 mol % being an exemplary concentration. The SOG (Spin On Glass) film is formed by the coating method on this PSG film. Such SOG film can have a thickness, e.g., of 900 Å±100 Å, and the material of such film can be a PSG, as used to form the gettering film. As an example, the coating method for forming the SOG film can include spin coating the SOG and solvent, and then baking the coated structure at 950° C. for 20 minutes. Thus, the layer insulation film 15 of 3-layer construction is formed. The silicon oxide film can be stacked and formed through the process of the high-temperature and low-pressure CVD method at a temperature of about 750° C. (e.g., 650°-750° C.) and a pressure of about 0.1-10 Torr. The temperature of 750° C. is lower than the thermal oxidation temperature of silicon, though it is higher than 650° C. The so-called auto-dope is thereby prevented. The auto-dope means that an impurity introduced in other portions of the conductive layer intrudes into the intrinsic portion during this process of stacking. The PSG film can be formed by the plasma CVD method and other various stacking methods, and the SOG film can be formed by the spin coating method, as is known in the art. As can be appreciated, the final pattern of the stacked film, formed on at least the intrinsic portion, can be provided by forming a stack of layers of silicon oxide, of PSG film and of SOG film, and then etching the stack of films to form the stacked film.

In the construction above described, the silicon oxide film is formed by the high-temperature and low-pressure CVD method directly on a high-resistance, namely, the intrinsic portion of the conductive layer made of polycrystalline silicon, so that the film formation is possible at a lower temperature than by the conventional thermal oxidation method and the auto-dope of an impurity to the intrinsic portion during this film formation can be prevented. As the PSG film is formed on this silicon oxide film which has been formed beforehand, the gettering effect (an effect of preventing intrusion of contaminating impurities) of the PSG film is provided, and the shielding effect of the silicon oxide film prevents a diffusion of phosphorus to the conductive layer, namely, the intrinsic portion of polycrystalline silicon. As a result, the intrusion of impurities into the intrinsic portion can be prevented securely, and fluctuations of the resistance value, the value of the high-resistance 14B is thereby prevented so as to obtain a stable and desirable charac- teristic.

On one hand, as the PSG film is coated with the SOG film, irregularities of the surface caused by the silicon oxide film and the PSG film can be flattened by the SOG film, so that the coverage of an aluminum wiring formed on the SOG film is improved.

Second Embodiment

Figure 11:
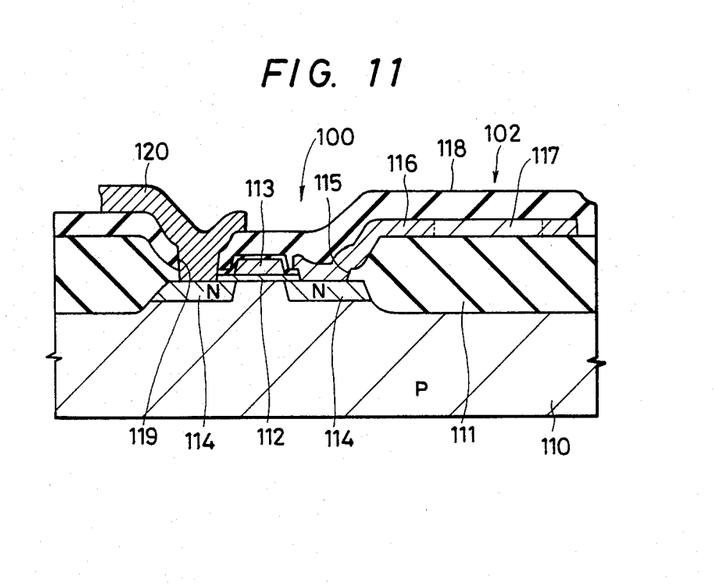
FIG. 11 is a schematic cross-section view of one embodiment of the present invention.

FIG. 11 shows an embodiment in which the present invention is applied to a SRAM and particularly shows the sectional construction of its memory cell in a schematic illustration. In this figure, a numeral 100 denotes an N-type MOSFET, and a numeral 102 denotes a high-resistance as a load resistance of this MOSFET. These and other MOSFETs and high-resistances which are not shown in the drawing constitute a static type memory cell.

The main portion of a P-type silicon substrate 110 is selectively oxidized so as to form a field insulation film 111 made of $SiO_2$ and a gate insulation film 112. A gate 113 is formed on the gate insulation film 112 by a part of a first polycrystalline silicon layer. N-type source and drain regions 114, 114 as formed by introducing an N-type impurity in the main surface of the silicon substrate 110. The gate 113 and the source and drain regions 114, 114 constitute the MOSFET 100. After the surface of the gate 113 is oxidized, the insulation film located on the drain region 114 is opened so as to form a contact hole 115. Then, a second polycrystalline silicon layer is formed over the whole surface and is processed by a selective etching, as is known in the art. An impurity is then introduced into portions of the polycrystalline silicon layer for the purpose of making such portions electrically conductive, as conductive portions 116, while the impurity is not introduced in a part of the polycrystalline silicon layer so as to form an intrinsic portion 117 of about $10^{11}$ $\Omega/\square$ resistance value as the high-resistance 102. A layer insulation film 118 is formed thereon, and a through hole 119 is formed in this insulation film 118 as desired, followed by the formation of an aluminum wiring 120. Thus, the memory cell is completed.

Figure 12:
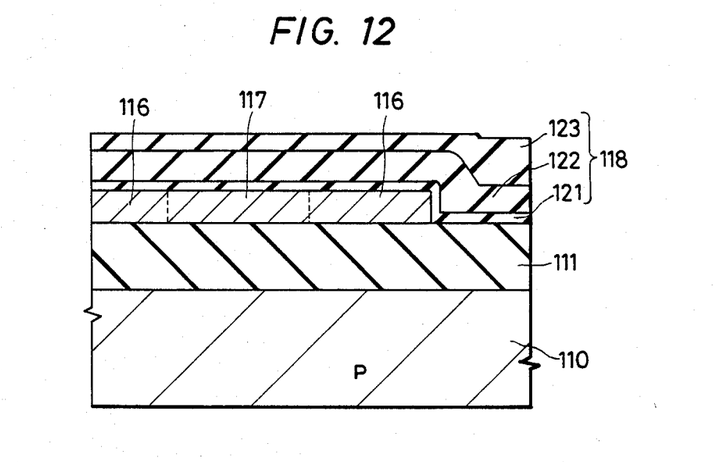
FIG. 12 is an enlarged sectional view of the essential part of the same.

FIG. 12 shows a portion in the vicinity of the high-resistance 102. A non-doped silicon oxide film 121, formed by the high-temperature and low-pressure CVD method without any diffused impurities, is stacked on the layer having conductive portion 116 and intrinsic portion 117, the intrinsic portion being formed as the high-resistance 102. A PSG film 122 as a gettering film is formed on this silicon oxide film 121. On this PSG film is formed a SOG (Spin On Glass) film 123 by coating. Thus, the layer insulation film 118 of 3-layer construction is formed. The silicon oxide film 121 can be stacked and formed through the process of the high-temperature and low-pressure CVD method at a temperature of about 750° C. and a pressure of about 0.1-10 Torr. The temperature of 750° C. is lower than the thermal oxidation temperature of silicon, though it is higher than 650° C. The so-called auto-dope is thereby prevented. The auto-dope means that an impurity introduced in conductive portions 116 of the polycrystalline silicon layer intrude into the intrinsic portion 117 during this process of stacking. The PSG film 122 can be formed by the plasma CVD method and other various stacking methods, and the SOG film 123 can be formed by the spin coating method.

In the construction above described, the silicon oxide film 121 is formed by the high-temperature and low-pressure CVD method directly on a high-resistance 102, namely, the intrinsic portion 117 of the layer made of polycrystalline silicon, so that the film formation is possible at lower temperature than the conventional thermal oxidation method and the auto-dope of an impurity to the intrinsic portion 117 during this film formation can be prevented. As the PSG film 122 is formed on this silicon oxide film 121 which has been formed beforehand, the gettering effect (an effect of preventing intrusion of contaminating impurities) of the PSG film 122 is provided, and the shielding effect of the silicon oxide film 121 prevents a diffusion of phosphorus into the intrinsic portion 117 of the polycrystalline silicon layer. As a result, the intrusion of impurities into the intrinsic portion 117 can be prevented securely, and fluctuations of the resistance value, that is, the value of the high-resistance 102 is thereby prevented so as to obtain a stable and desirable characteristic.

On one hand, as the PSG film 122 is coated with the SOG film 123, irregularities of the surface caused by the silicon oxide film 121 and the PSG film 122 can be flattened by the SOG film 123, so that the coverage of an aluminum wiring 120 formed on the SOG film 123 is improved.

Advantages of the present invention are noted in sequence as follows.

(1) The silicon oxide film formed by the high-temperature and low-pressure CVD method is provided as the layer insulation film formed on the high-resistance made of polycrystalline silicon. Accordingly, the film formation of the silicon oxide film can be carried out at a lower temperature than the thermal oxidation method, so that the auto-dope of an impurity to the high-resistance portion is prevented. Fluctuations of the value of the high resistance are thereby prevented.

(2) As the silicon oxide film is formed under the gettering film such as a PSG film, an impurity such as phosphorus is obstructed by the silicon oxide film. The impurity can not be introduced into the high-resistance portion, so that fluctuations of the value of the high-resistance are prevented.

(3) As fluctuations of the high resistance can be securely prevented, an improvement in characteristics of the semiconductor device, such as stabilization, can be realized.

(4) The silicon oxide film formed by the high-temperature and low-pressure CVD method is superior in step coverage to the thermal oxide film. As the SOG film is formed by the spin coating process as the upper layer, the upper surface of the layer insulation film can be flattened so as to improve the coverage of the aluminum wiring formed in the upper layer and heighten the reliability.

The invention presented by the inventors has been described, being based on the embodiments, but the present invention is not limited to the embodiments above described. It is natural that the present invention can be variously altered within the scope of its essentials. For example, a BSG (Borosilicate Glass) film or other kinds than the PSG film may be applied as the gettering film. When the flatness is not essential, the SOG layer formed as the uppermost layer of the insulation film on polycrystalline silicon can be omitted.

In the above description, the invention presented by the inventors has been described with respect to the memory cell of an SRAM, as an exemplary conductor device to which the present invention can be applied, but the present invention is not limited to this and can similarly be applied to any semiconductor device of the type in which elements, such as resistance elements, are constituted by polycrystalline layers.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. Process of fabricating a semiconductor device having at least one element constituted by polycrystalline silicon, the polycrystalline silicon having portions which have been doped with an impurity and portions which are substantially undoped, said process comprising the steps of forming a silicon oxide film on said polycrystalline silicon, which polycrystalline silicon has portions that have been doped with an impurity and portions that are substantially undoped, said silicon oxide film being formed by the CVD method, and forming a gettering film on said silicon oxide film.

2. Process according to claim 1, wherein said at least one element is at least one resistance element.

3. Process according to claim 1, wherein the substantially undoped portions of the polycrystalline silicon are intrinsic portions.

4. Process according to claim 1, wherein the CVD method is performed at a sufficiently low temperature such that said impurity does not diffuse from the doped portions of the polycrystalline silicon into the substantially undoped portions.

5. Process according to claim 1, wherein said at least one element is at least one resistance element, the portions of the polycrystalline silicon that are substantially undoped constituting the resistance elements.

6. Process according to claim 5, wherein the CVD method is performed at a sufficiently low temperature such that said impurity does not diffuse from the doped portions of the polycrystalline silicon into the substantially undoped portions.

7. Process according to claim 1, wherein said silicon oxide film is formed by the CVD method at a temperature of 650°–750° C. and a pressure of 0.1–10 Torr.

8. Process according to claim 1, wherein said gettering film is a PSG film.

9. Process according to claim 1, wherein said gettering film is a BSG film.

10. Process according to claim 1, wherein said silicon oxide film is formed directly on the polycrystalline silicon, on the portions thereof that are substantially undoped.

11. A product produced by the process according to claim 1.

12. Process of fabricating a semiconductor device having at least one element constituted by polycrystalline silicon which has portions that have been doped with an impurity and portions that are substantially undoped, said process comprising the steps of forming a silicon oxide film on said polycrystalline silicon, which polycrystalline silicon has portions that have been doped with an impurity and portions that are substantially undoped, said silicon oxide film being formed by the CVD method, forming a gettering film on said silicon film, and forming a SOG film on said gettering film.

13. Process according to claim 12, wherein the SOG film is formed so as to provide a flatter surface than the surface of the gettering film after forming the gettering film on the silicon oxide film.

14. Process according to claim 13, comprising the further step of forming a wiring layer on the SOG film.

15. Process according to claim 12, comprising the further step of forming a wiring layer on the SOG film.

16. Process according to claim 12, wherein said gettering film is a PSG film.

17. Process according to claim 12, wherein said gettering film is a BSG film.

18. Process according to claim 12, wherein said at least one element is at least one resistance element.

19. Process according to claim 12, wherein the substantially undoped portions of the polycrystalline silicon are intrinsic portions.

20. Process according to claim, 12 wherein the CVD method is performed at a sufficiently low temperature such that said impurity does not diffuse from the doped portions of the polycrystalline silicon into the substantially undoped portions.

21. Process according to claim 12, wherein said at least one element is at least one resistance element, the portions of the polycrystalline silicon that are substantially undoped constituting the resistance elements.

22. Process according to claim 21, wherein the CVD method is performed at a sufficiently low temperature such that said impurity does not diffuse from the doped portions of the polycrystalline silicon into the substantially undoped portions.

23. Process according to claim 12, wherein said gettering film is a PSG film.

24. Process accoring to claim 12, wherein said gettering film is a BSG film.

25. A product produced by the process according to claim 12.

26. Process of fabricating a semiconductor device having at least one element constituted by polycrystalline silicon which has portions that have been doped with an impurity and portions that are substantially undoped, said process comprising:

the step of forming a silicon oxide film on said polycrystalline silicon, which polycrystalline silicon has portions that have been doped with an impurity and portions that are substantially undoped, the silicon oxide film being formed by the CVD method, at a temperature of 650°–750° C. and a pressure of 0.1–10 Torr.

the step of forming a gettering film on said silicon oxide film; and the step of forming a SOG film on said gettering film.

27. Process according to claim 26, wherein the SOG film is formed so as to provide a flatter surface than the surface of the gettering film after forming the gettering film on the silicon oxide film.

28. Process according to claim 27, comprising the further step of forming a wiring layer on the SOG film.

29. Process according to claim 26, comprising the further step of forming a wiring layer on the SOG film.

30. Process according to claim 26, wherein said gettering film is a PSG film.

31. Process according to claim 26, wherein said gettering film is a BSG film.

32. A product produced by the process according to claim 26.

33. Process of fabricating a semiconductor device having at least one element constituted by polycrystalline silicon, the polycrystalline silicon having portions which have been doped with an impurity and portions which are substantially undoped, said process comprising the steps of forming a silicon oxide film on said polycrystalline silicon by the CVD method, and forming a gettering film directly on the silicon oxide film.

* * * * *